United States Patent
Luk et al.

(10) Patent No.: US 9,625,662 B2
(45) Date of Patent: Apr. 18, 2017

(54) METHOD AND SYSTEM HAVING A TRANSIMPEDANCE AMPLIFIER CIRCUIT WITH A DIFFERENTIAL CURRENT MONITORING DEVICE FOR MONITORING OPTICAL RECEIVER CIRCUIT

(71) Applicants: Tom Luk, Ottawa (CA); Christopher Falt, Nepean (CA)

(72) Inventors: Tom Luk, Ottawa (CA); Christopher Falt, Nepean (CA)

(73) Assignee: Ciena Corporation, Hanover, MD (US)

( * ) Notice: Subject to any disclaimer, the term of this patent is extended or adjusted under 35 U.S.C. 154(b) by 21 days.

(21) Appl. No.: 14/856,095

(22) Filed: Sep. 16, 2015

(65) Prior Publication Data

US 2017/0075081 A1 Mar. 16, 2017

(51) Int. Cl.
- *G02B 6/42* (2006.01)
- *H03F 3/08* (2006.01)
- *G01J 1/44* (2006.01)
- *G01R 19/10* (2006.01)

(52) U.S. Cl.
CPC .............. *G02B 6/4225* (2013.01); *G01J 1/44* (2013.01); *G01R 19/10* (2013.01); *G02B 6/4227* (2013.01); *H03F 3/08* (2013.01)

(58) Field of Classification Search
CPC ....... G02B 6/4286; G02B 6/4225; G01J 1/44; G01J 9/0246
USPC ............................ 250/214 R, 214 LA, 214 A
See application file for complete search history.

(56) References Cited

U.S. PATENT DOCUMENTS

| | | | |
|---|---|---|---|
| 9,191,124 B2* | 11/2015 | Maasi | ................... H04B 1/587 |
| 2012/0281991 A1 | 11/2012 | Sugimoto | |
| 2013/0336650 A1 | 12/2013 | Azadeh | |

FOREIGN PATENT DOCUMENTS

JP     2008010990 A    1/2008

OTHER PUBLICATIONS

Optical Internetworking Forum, Implementation Agreement for Integrated Dual Polarization Micro-Intradyne Coherent Receivers, IA # OIR-DPC-MRX-01.0, Mar. 31, 2015 (32 Pages).
Extended European Search Report issued in counterpart European Patent Application No. 16188164.4, mailed Feb. 15, 2017 (9 pages).

* cited by examiner

*Primary Examiner* — Que T Le
(74) *Attorney, Agent, or Firm* — Osha Liang LLP

(57) ABSTRACT

A method for monitoring a circuit. The method may include obtaining, using a total current monitoring device, a measurement of a current transmitted through a cathode in a photodetector circuit. The current may include a first photocurrent for a first photodetector and a second photocurrent for a second photodetector. The method may include obtaining, using a differential current monitoring device in a transimpedance amplifier circuit, a differential voltage proportional to a current difference between the first photocurrent and the second photocurrent. The transimpedance amplifier circuit may generate, using the first photocurrent and the second photocurrent, a first output signal and a second output signal. The method may include determining, using the differential voltage and the measurement of the current transmitted through the cathode, an amount of the first photocurrent and an amount of the second photocurrent.

20 Claims, 7 Drawing Sheets

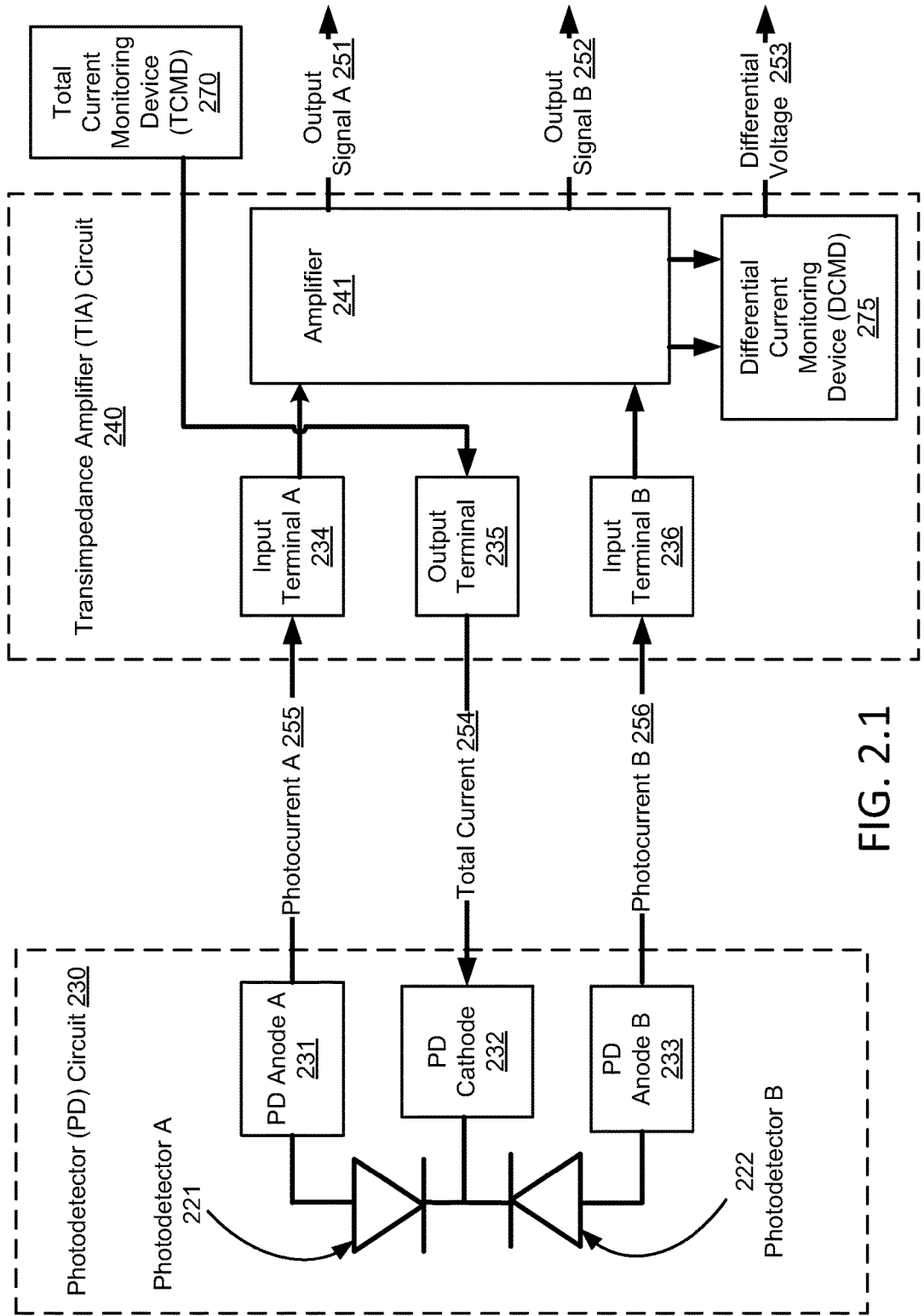
FIG. 2.1

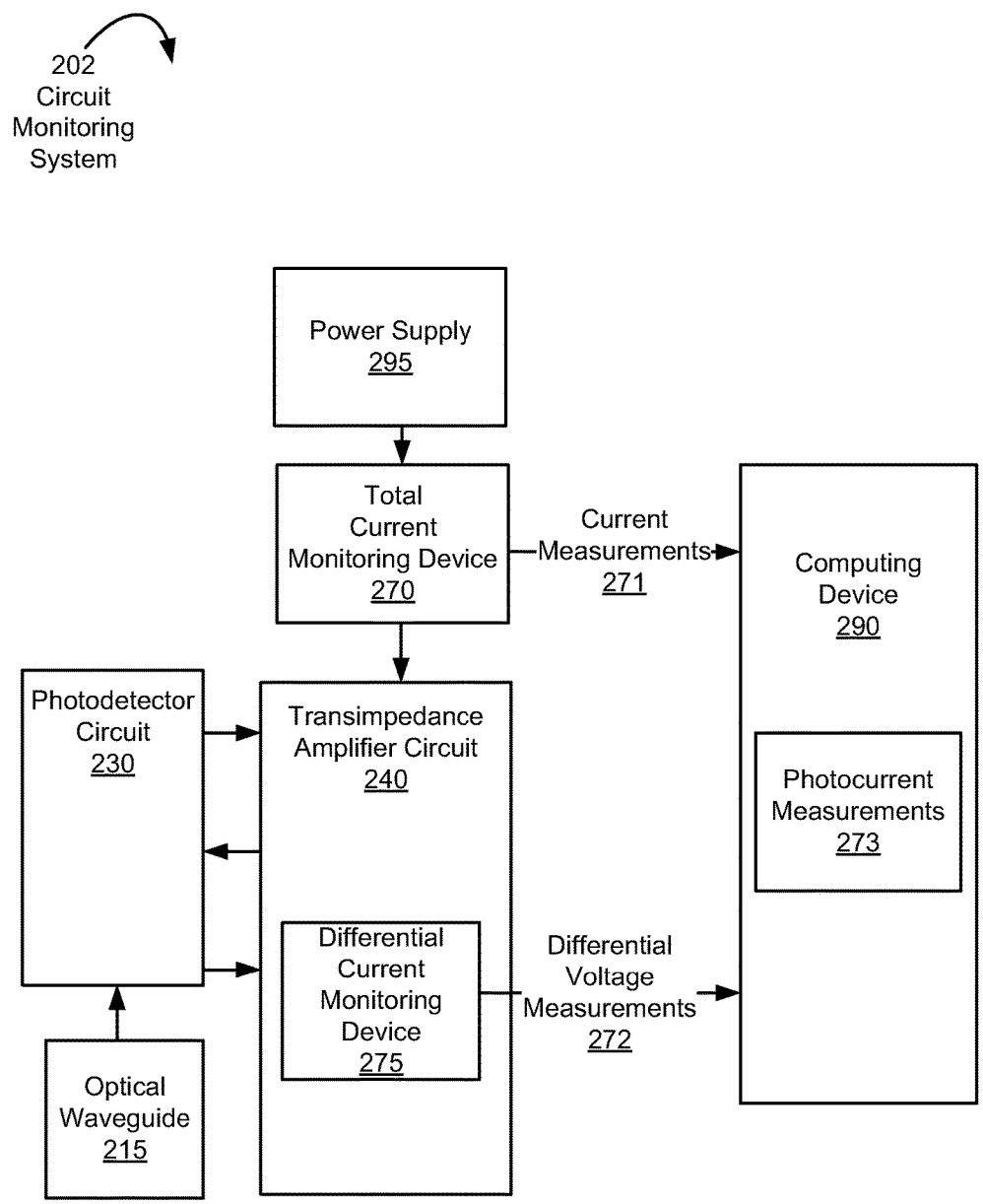
FIG. 2.2

METHOD AND SYSTEM HAVING A TRANSIMPEDANCE AMPLIFIER CIRCUIT WITH A DIFFERENTIAL CURRENT MONITORING DEVICE FOR MONITORING OPTICAL RECEIVER CIRCUIT

BACKGROUND

Optical networks may transfer data over light waves. For example, a particular light wave may be generated at an optical transmitter and forwarded over an optical network to an optical receiver. Using an optical protocol, various light waves may be multiplexed using different frequency channels for transmission through the same transmission medium to various optical receivers. At the optical receivers, the light waves may be decoded into electrical signals.

SUMMARY

In general, in one aspect, embodiments relate to a system that includes a photodetector circuit. The photodetector circuit includes a first photodetector, a second photodetector, and a cathode coupled to the first photodetector and the second photodetector. The system further includes a total current monitoring device that measures an amount of current transmitted through the cathode. The system further includes a transimpedance amplifier circuit that is coupled to the photodetector circuit and the total current monitoring device. The transimpedance amplifier circuit includes a first input terminal that obtains a first photocurrent from the first photodetector. The transimpedance amplifier circuit further includes a second input terminal that obtains a second photocurrent from the second photodetector. The transimpedance amplifier circuit further includes an amplifier that outputs, using the first photocurrent and the second photocurrent, a first output signal and a second output signal. The transimpedance amplifier circuit further includes a differential current monitoring device that determines a differential voltage proportional to a current difference between the first photocurrent and the second photocurrent.

In general, in one aspect, embodiments relate to a transimpedance amplifier circuit that includes an output terminal that transmits a current to a cathode in a photodetector circuit. The transimpedance amplifier circuit further includes a first input terminal that obtains a first photocurrent from a first photodetector in the photodetector circuit. The transimpedance amplifier circuit further includes a second input terminal that obtains a second photocurrent from a second photodetector in the photodetector circuit. The transimpedance amplifier circuit further includes an amplifier that outputs, using the first photocurrent and the second photocurrent, a first output signal and a second output signal. The transimpedance amplifier circuit further includes a differential current monitoring device coupled to the amplifier. The differential current monitoring device determines a differential voltage proportional to a current difference between the first photocurrent and the second photocurrent.

In general, in one aspect, embodiments relate to a method for monitoring a circuit. The method includes obtaining, using a total current monitoring device, a measurement of a current transmitted through a cathode in a photodetector circuit. The current includes a first photocurrent for a first photodetector and a second photocurrent for a second photodetector. The method further includes obtaining, using a differential current monitoring device in a transimpedance amplifier circuit, a differential voltage proportional to a current difference between the first photocurrent and the second photocurrent. The transimpedance amplifier circuit generates, using the first photocurrent and the second photocurrent, a first output signal and a second output signal. The method further includes determining, using the differential voltage and the measurement of the current transmitted through the cathode, an amount of the first photocurrent and an amount of the second photocurrent.

Other aspects of the invention will be apparent from the following description and the appended claims.

BRIEF DESCRIPTION OF DRAWINGS

FIGS. 1, 2.1, and 2.2 show systems in accordance with one or more embodiments.

DETAILED DESCRIPTION

Figure 1:
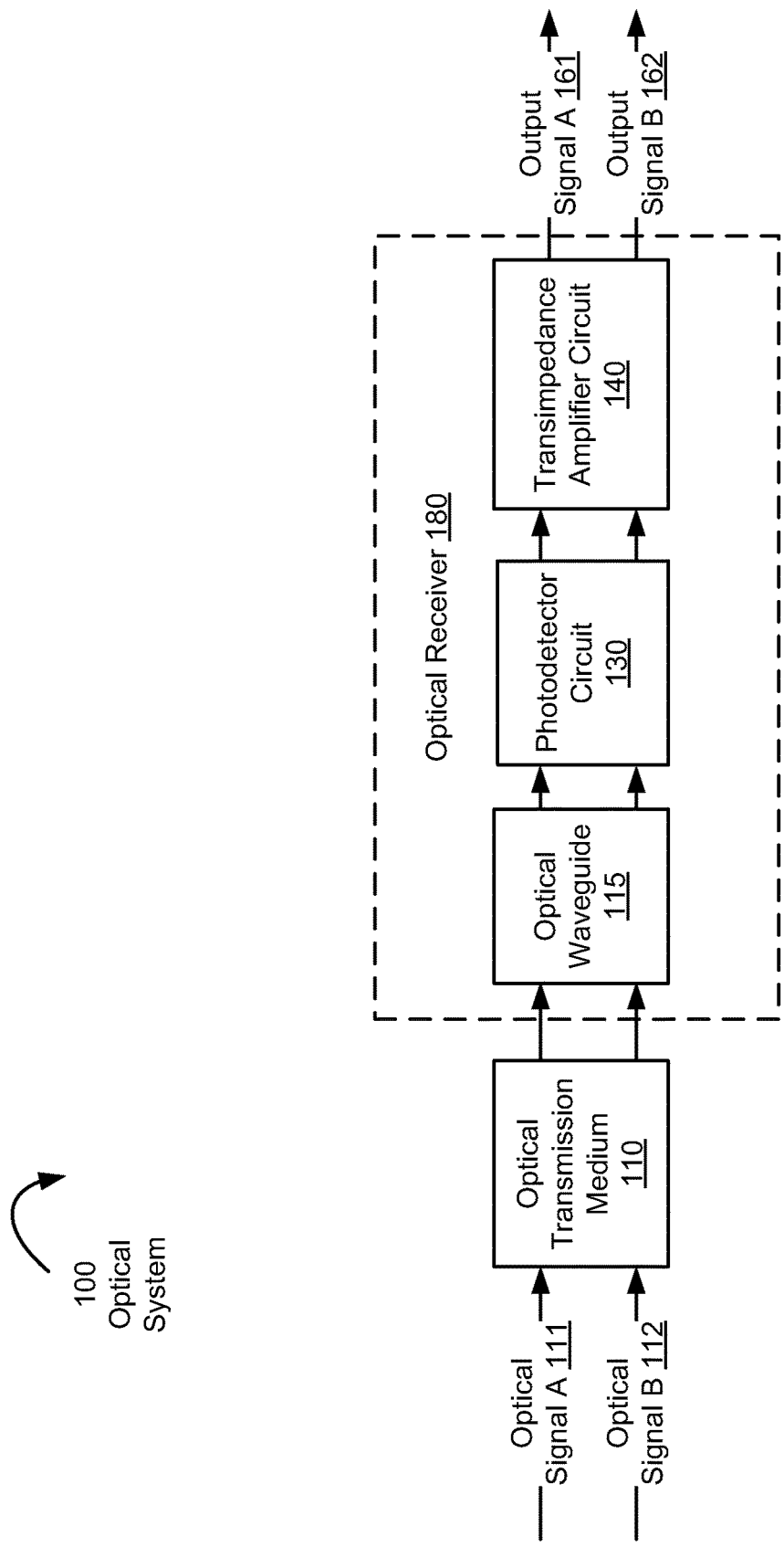

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention include a system, a transimpedance amplifier circuit, and a method for monitoring a circuit. In particular, one or more embodiments are directed to a system that includes a total current monitoring device that measures a total amount of electrical current used to generate photocurrent within a photodetector circuit. The system also includes a differential current monitoring device coupled to a transimpedance amplifier. Specifically, the differential current monitoring device may measure a differential voltage proportional to a current difference between two photocurrents used as inputs to the transimpedance amplifier. Accordingly, the total current monitoring device and the differential current monitoring device may determine the individual photocurrent amounts for each photodetector within the photodetector circuit. In one or more embodiments, for example, individual photocurrent measurements may be used to align an optical waveguide to the pair of photodetectors to obtain a particular common mode rejection ratio for the transimpedance amplifier's output signals.

FIG. 1 shows a block diagram of a system in accordance with one or more embodiments. In one or more embodiments, as shown in FIG. 1, an optical system (100) includes an optical transmission medium (110) and an optical receiver (180). The optical receiver (180) may include an optical waveguide (115), a photodetector (PD) circuit (130), a transimpedance amplifier (TIA) circuit (140), and various other components such as a local oscillator (not shown) or an optical signal amplifier (not shown). Specifically, various optical signals (e.g., optical signal A (111), optical signal B (112)) may be transmitted over the optical transmission medium (110) to the optical receiver (180). The optical transmission medium (110) may be a type of physical medium, such as a single mode optical fiber, that is configured to transport the optical signals (111, 112) from an optical transmitter (not shown) to the optical receiver (180). Thus, the optical receiver (180) may decode the optical signals (111, 112) and output various electrical signals (e.g., output signal A (161), output signal B (162)), which may form a differential signal.

The optical waveguide (115) may be a physical structure configured to guide the optical signals (111, 112) to the photodetector circuit (130). For example, the optical waveguide (115) may be attached to the optical transmission medium (110) and configured to transfer the optical signals through a photonic integrated circuit (not shown) to one or more photodetectors in the photodetector circuit (130).

In one or more embodiments, the photodetector circuit (130) may include various photodetectors configured to generate various photocurrents in response to the optical signals (111, 112). In one or more embodiments, for example, the photodetector circuit (130) is a hardware electrical circuit, e.g., a portion of an integrated circuit with electrical and/or optical components, with the photodetectors embedded or attached to the integrated circuit. A photocurrent may be a direct current (DC) produced by a photodetector in response to an input voltage being applied across the photodetector while receiving an optical signal. As such, the photodetector circuit (130) may be configured to interface with the TIA circuit (140). The TIA circuit (140) may be a portion of an integrated circuit as well that includes a transimpedance amplifier. Specifically, the TIA circuit (140) may be a current-to-voltage converter, i.e., the TIA circuit (140) generates an output voltage based on current inputs to the TIA circuit (140). Thus, the TIA circuit (140) may obtain the photocurrents to generate respective voltage signals, e.g., the output signals (161, 162), accordingly.

Turning to FIG. 2.1, FIG. 2.1 shows a block diagram of a system in accordance with one or more embodiments. In FIG. 2.1, the system includes a photodetector circuit (230) that interfaces with a TIA circuit (240). In particular, the photodetector circuit (230) may include various photodetectors (e.g., photodetector A (221), photodetector B (222)) various circuit terminals (e.g, PD anode A (231), PD cathode (232), PD anode B (233)), and other circuit components such as capacitors, resistors, amplifiers, etc. For example, the photodetectors (221, 222) may be photodiodes, but in other embodiments, the photodetectors (221, 222) may include other types of photosensors, such as photosensors based on photoemissive or photovoltaic materials. Thus, the photodetector circuit (230) may obtain a total current (254) from the TIA circuit (240), while transmitting various photocurrents (e.g., photocurrent A (255), photocurrent B (256)) back to the TIA circuit (240). In one or more embodiments, the total current (254) is transmitted through the PD cathode (232) and includes photocurrent A (255) and photocurrent B (256).

In one or more embodiments, the photodetector circuit (230) is an anode-cathode-anode (ACA) configuration with a common cathode, e.g., PD cathode (232), for the photodetectors (221, 222). In other words, the common cathode is shared by both photodetectors (221, 222). Where a photodetector has positive polarity on one side and a negative polarity on a different side within the photodetector circuit (230), the common cathode may provide photocurrent and an input voltage to the side of each photodetector (221, 222) with the positive polarity. The ACA configuration may reduce excess inductance that is generated between grounds in a photodetector circuit and/or a TIA circuit as found in a ground-anode-anode-ground configuration for an optical receiver. In one or more embodiments, the ACA configuration eliminates the requirement for a shunt capacitor between separate cathodes of two photodetectors. While only one ACA configuration is shown, in one or more embodiments, an optical receiver may include multiple photodetector circuits and TIA circuits with multiple ACA configurations where multiple differential signals are generated by the optical receiver.

In one or more embodiments, various interconnections are disposed between the photodetector circuit (230) and the TIA circuit (240). Specifically, the interconnects may connect the anodes (231, 233) to the input terminals (234, 236). One interconnection may connect the output terminal (235) on the TIA circuit (240) to the PD cathode (232). The interconnections may be, for example, bond wires.

Keeping with FIG. 2.1, the TIA circuit (240) may include an amplifier (241), a differential current monitoring device (275), various circuit terminals (e.g., input terminal A (234), output terminal (235), input terminal B (236)), and various other circuit components such as resistors, capacitors, amplifiers, etc. In one or more embodiments, the amplifier (241) is an operational amplifier, but in other embodiments, other types of amplifiers may be used. In one or more embodiments, the input terminals (234, 236) are part of the amplifier, e.g., as input terminals to an operational amplifier. As such, the TIA circuit (240) may obtain the photocurrents (255, 256) as inputs to the amplifier (241) for use in generating the output signals (251, 252).

In one or more embodiments, the TIA circuit (240) includes a differential current monitoring device (DCMD) (275) that measures a current difference between the photocurrents (255, 256) within the amplifier (241). Thus, in one or more embodiments, the DCMD (275) outputs a differential voltage (253) that is proportional to electrical current difference between the photocurrents (255, 256). In one or more embodiments, the differential voltage (253) corresponds to a difference between the photocurrents (255, 256) below 1 MHz, while the output signals (251, 252) correspond to a difference between the photocurrents (255, 256) above 1 Mhz. Thus, the output signals (251, 252) may be transmitted at frequencies in the information band, while the differential voltage (253) may be transmitted at frequencies outside the information band. For example, the DCMD (275) may be a circuit coupled to the amplifier (241) or located inside the amplifier (241). Thus, in one or more embodiments, the circuit for the DCMD (275) may include a differential amplifier with two input terminals where each input terminal receives an input voltage generated by one of the photocurrents (255, 256). In one or more embodiments, for example, the DCMD (275) is a differential transimpedance amplifier circuit that receives the photocurrents (255, 256) as inputs to produce the differential output voltage. In one or more embodiments, the DCMD (275) outputs differential voltage measurements to a computing device (not shown) for calculating an amount of current in photocurrent A (255) and photocurrent B (256).

In one or more embodiments, the TIA circuit (240) is coupled to a total current monitoring device (TCMD) (270). As shown in FIG. 2.1, the TCMD (270) may be located outside the TIA circuit (270), but in other embodiments, the TCMD (270) may be disposed inside the TIA circuit (240). Specifically, the TCMD (270) may be circuitry configured to measure and/or output the amount of current passing through the circuit to another device. For example, the TCMD (270) may be a monitoring circuit external to the TIA circuit (270) as shown in FIG. 2.1 or that is part of the TIA circuit (240). Thus, the TCMD (270) may be a circuit that includes various resistors, capacitors, amplifiers, and other electrical components that may actively or passively measure the total current (254).

In one or more embodiments, the TCMD (270) is coupled to a power supply (not shown) for monitoring the total current (254) that enters the photodetector circuit (230) through the output terminal (235) in the TIA circuit (240). In one or more embodiments, the TCMD (270) outputs current measurements to a computing device (not shown) for calculating photocurrent A (255) and photocurrent B (256).

Turning to FIG. 2.2, FIG. 2.2 shows a block diagram of a system in accordance with one or more embodiments. As shown in FIG. 2.2, a circuit monitoring system (202) may include the photodetector circuit (230), the TIA circuit (240) having the differential current monitoring device (275), the TCMD (270), and a computing device (290). As shown, the TCMD (270) may be coupled to a power supply (295) for providing current and an input voltage through the TIA circuit (240) and to the photodetector circuit (230). The TCMD (270) may also be coupled to the computing device (290) for transmitting current measurements (271) regarding a total current transmitted into the TIA circuit (240) and/or to the photodetector circuit (230).

In one or more embodiments, the circuit monitoring system (202) is configured to align an optical waveguide (215) to one or more photodetectors in the photodetector circuit (230). Specifically, the computing device (290) may obtain current measurements (271) from the TCMD (270) and differential voltage measurements (272) from the DCMD (275) to determine the photocurrent passing through the photodetector circuit (230). In one or more embodiments, for example, the TIA circuit (240) may be an integrated circuit on a chip having various electrical connector pins, where one of the electrical connector pins provides an output signal for the differential voltage measurements (272) determined by the DCMD (275). One of the electrical connector pins on the TIA circuit (240) may also provide an input voltage from the power supply (295) to the photodetector circuit (230).

While one computing device (290) is shown in FIG. 2.2, the computing device (290) may include separate computing devices, e.g., one computing device configured to obtain the current measurements (271) and another computing device configured to obtain the differential voltage measurements. For example, the computing device (290) may be a voltmeter. For more information on the computing device (290), see FIG. 6 and the accompanying description.

In one or more embodiments, the circuit monitoring system (202) determines various photocurrent measurements (273) regarding the photodetectors (221, 222). In one or more embodiments, the photocurrent measurements (273) are used to align the optical waveguide (215) with the photodetector circuit (230). The photocurrent measurements (273) may describe current values for individual photocurrents within the photodetector circuit (230) and/or the TIA circuit (240). For more information on aligning the optical waveguide (215) to the photodetector circuit (230), see FIG. 5 and the accompanying description below.

In one or more embodiments, the circuit monitoring system (202) is used to perform various design tests on an optical receiver. In particular, the circuit monitoring system (202) may determine whether the photodetector circuit (230) and/or the TIA circuit (240) satisfies various design specifications, such as a predetermined common mode rejection ratio (CMRR) that is specified by an optical communication standard. For example, the predetermined CMRR may describe an optical receiver's capability to reject interfering optical channels in a particular optical system.

In one or more embodiments, the circuit monitoring system (202) measures various amounts of crosstalk between various optical signals transmitted to photodetectors in the photodetector circuit (230). For example, crosstalk may include signal interference generated by one optical signal with respect to another optical signal within the same optical transmission medium. In one or more embodiments, the circuit monitoring system (202) also measures various amounts of distortion within the amplifier (241) using the photocurrent measurements (273). In one or more embodiments, the circuit monitoring system (202) measures background noise located within the photodetector circuit (230) and/or the transimpedance amplifier circuit (240). In one or more embodiments, the circuit monitoring system (202) is used in conjunction with an optical carrier phase locker (not shown) for implementing a phase lock loop (PLL) circuit coupled with the photodetector circuit (230). The PLL circuit may include a voltage controlled oscillator, a phase detector, and a loop filter, where the PLL circuit may obtain a clock signal with low jitter from the output signals (251, 252) of the TIA circuit (240).

In one or more embodiments, the circuit monitoring system (202) may provide the capability to test and/or verify various design specifications within an optical receiver. The circuit monitoring system (202) may be used during the optical receiver's manufacturing process or during an experimentation phase of development in order to optimize components within the optical receiver.

Figure 3:
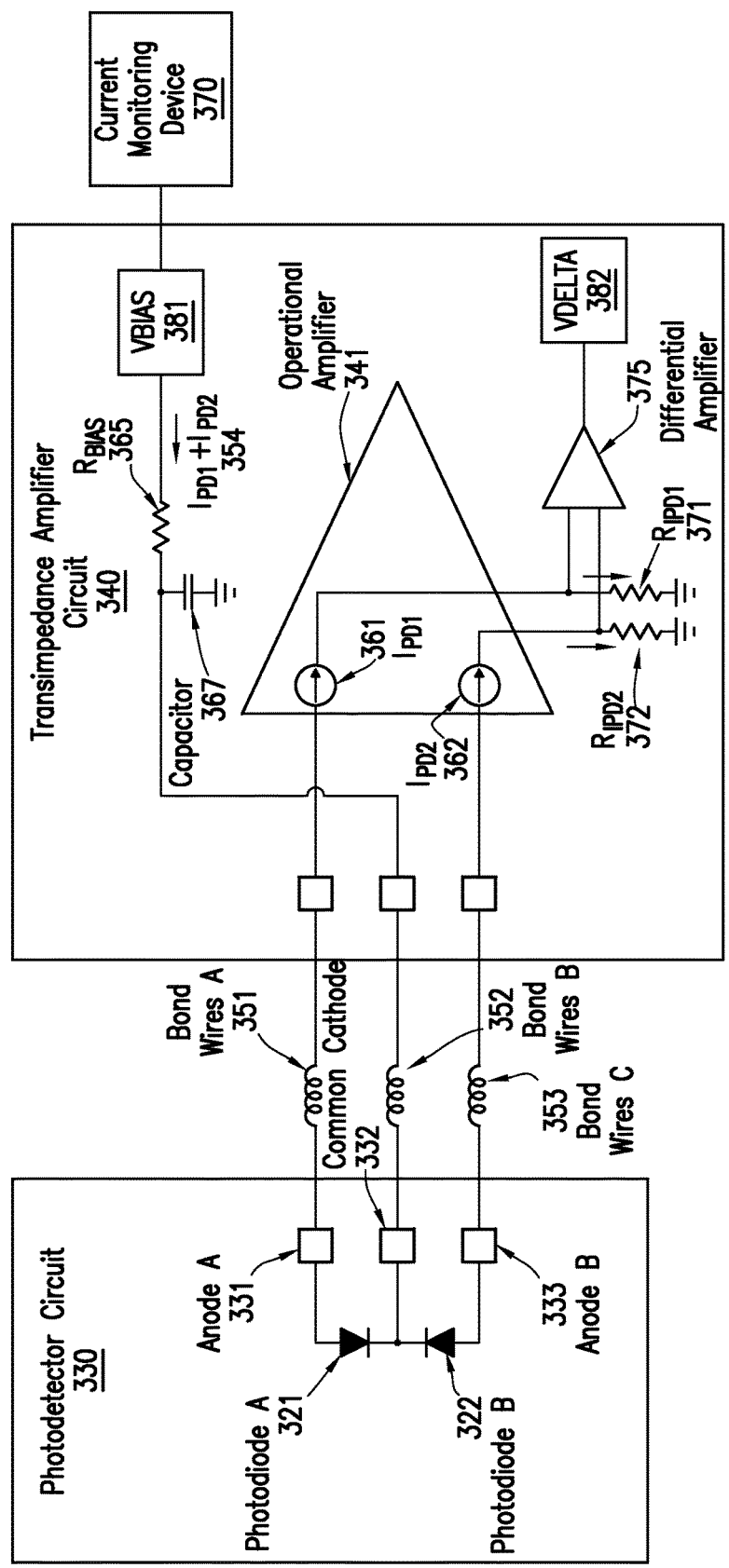
FIGS. 3 and 4 show examples in accordance with one or more embodiments.
Figure 4:
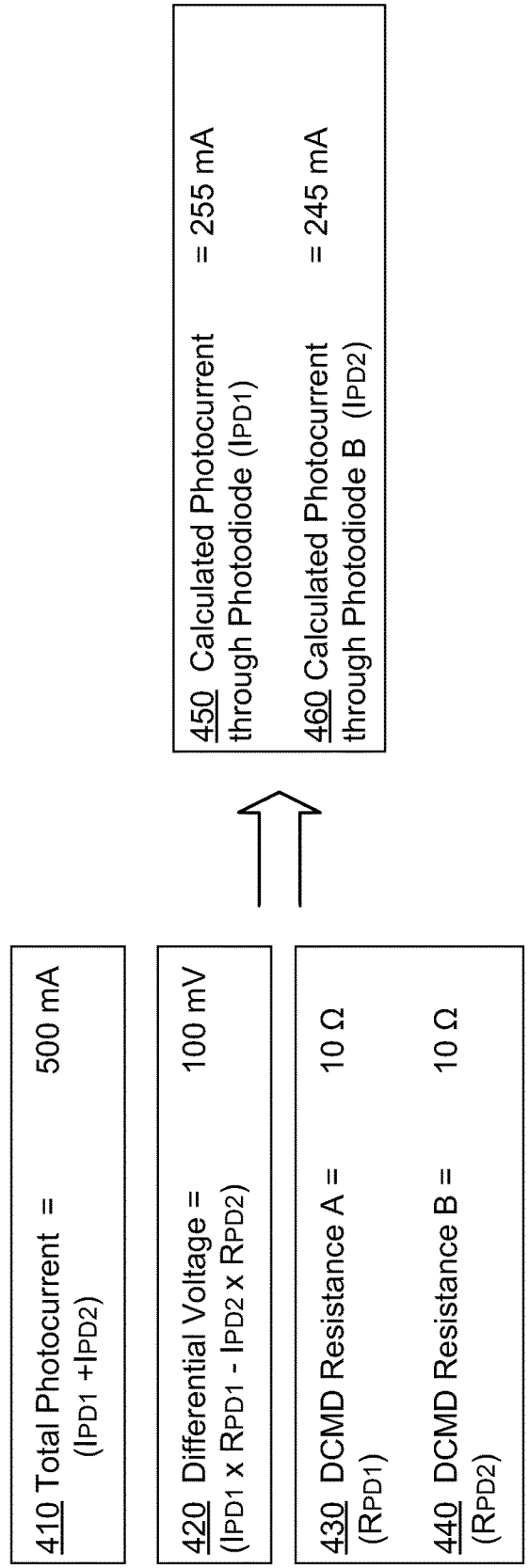

FIGS. 3 and 4 provide examples of monitoring photocurrent within a system. The following examples are for explanatory purposes only and not intended to limit the scope of the invention. Turning to FIG. 3, FIG. 3 provides an example of a photodetector circuit (330) with a physical interface with a TIA circuit (340). Thus, the photodetector circuit (330) interfaces with the TIA circuit (340) over various interconnections (i.e., bond wires A (351), bond wires B (352), bond wires C (353)). As shown in FIG. 3, a total photocurrent ($I_{PD1}+I_{PD2}$) (354) flows from a bias voltage connector pin (VBIAS) (381) to the photodetector circuit (330). In particular, $I_{PD1}+I_{PD2}$ (354) flows through the input resistance (365) of the bias voltage in parallel with a capacitor (367). Thus, $I_{PD1}+I_{PD2}$ (354) is measured by a current monitoring device (370).

Keeping with FIG. 3, the photodetector circuit (330) includes a photodiode A (321) and a photodiode B (322) with a common cathode (332) coupled to the sides of each photodiode (321, 322) with a positive polarity. For the photodiode A (321), the side with the negative polarity is connected to anode A (331). For the photodiode B (322), the side with the negative polarity is connected to anode B (333). As such, $I_{PD1}+I_{PD2}$ (354) flows through the common cathode (332) where the $I_{PD1}+I_{PD2}$ (354) separates according to each photodiode (321, 322) before traveling through the anodes (331, 333). Furthermore, an operational amplifier (341) within the TIA circuit (340) obtains, from photodiode A (321), a photocurrent ($I_{PD1}$) (361) at one input terminal and, from photodiode B (322), another photocurrent ($I_{PD2}$) (362) at another input terminal.

Furthermore, within the TIA circuit (340), a differential current monitoring device is implemented using a differential amplifier (375) with two voltage input terminals. One voltage input terminal corresponds to a voltage generated by $I_{PD1}$ (361) across a resistor ($R_{PD1}$) (371), while another voltage input terminal corresponds to a voltage generated by $I_{PD2}$ (362) across another resistor ($R_{PD2}$) (372). Thus, the differential amplifier (375) outputs the difference between the two voltages as a differential voltage signal to a differential voltage connector pin (VDELTA) (382).

Turning to FIG. 4, FIG. 4 provides an example of calculating individual photocurrents. As shown in FIG. 4, the total photocurrent (410) as measured by a current monitoring device is 500 mA. Using a DCMD similar to the one shown in FIG. 3, a differential voltage (420) is measured at 100 mV. In particular, the DCMD includes a DCMD resistance A (430) that is 10 ohms and a DCMD resistance B (440) that is also 10 ohms. Using the DCMD implementation shown in FIG. 3, multivariable mathematical operations are performed with the total photocurrent (410), the differential voltage (420), and the resistances of DCMD resistance A (430) and DCMD resistance B (440) to calculate individual photocurrent values. Specifically, where $I_{PD1}=500$ mA$-I_{PD2}$ and 100 mV=(10 ohm)×(500 mA$-I_{PD2}$)$-I_{PD2}$×(10 ohm), the calculated photocurrent (450) through the photodiode A (321) is calculated as 255 mA, while the calculated photocurrent (460) through photodiode B (322) is calculated as 245 mA.

Figure 5:
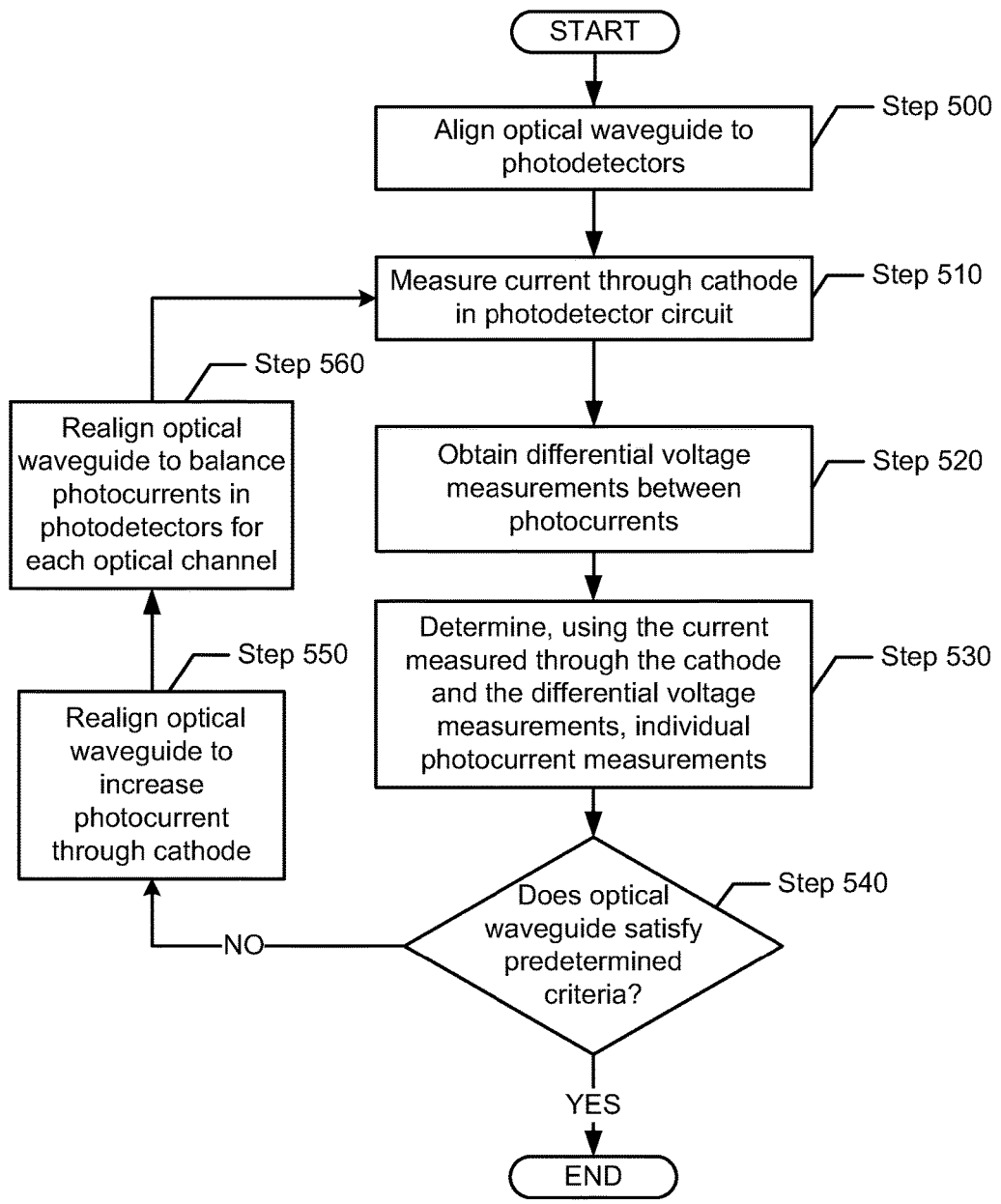
FIG. 5 shows a flowchart in accordance with one or more embodiments.

FIG. 5 shows a flowchart in accordance with one or more embodiments. Specifically, one or more steps in FIG. 5 may be performed by the circuit monitoring system as described in FIG. 2.2. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 500, one or more optical waveguides are aligned to various photodetectors in accordance with one or more embodiments. In particular, an optical beam emanating from the optical waveguide may be matched to a photodetector located in a photodetector circuit. Achieving a desired match through this optical alignment may result in a desired photocurrent produced by a photodetector in response to a particular optical signal.

In Step 510, a current is measured through a cathode in a photodetector circuit in accordance with one or more embodiments. In particular, various current measurements may be obtained regarding the total current transmitted through the cathode using a current monitoring device. Thus, the current monitoring device may passively record the amount of current that directly enters the cathode or may be used at another location within the circuit to perform current measurements through the cathode. For example, the amount of current may be measured at a transimpedance amplifier circuit's connector pin where current passes through to the photodetector circuit. In one or more embodiments, the current monitoring device is placed between a power supply and a pair of photodetectors powered by the power supply.

In Step 520, differential voltage measurements are obtained between various photocurrents in accordance with one or more embodiments. In one or more embodiments, the differential voltage measurements are obtained from a differential current monitoring device (DCMD). The DCMD may be configured to output a voltage signal that corresponds to a current difference between two photocurrents. In particular, the DCMD may be a circuit internal to a transimpedance amplifier circuit or external to both the photodetector circuit and the transimpedance amplifier circuit.

In one or more embodiments, a transimpedance amplifier circuit includes a pair of connector pins that output a voltage for each photocurrent within the transimpedance amplifier circuit. Thus, a computing device coupled to the pair of connector pins may obtain voltage measurements accordingly to calculate the differential voltage between the corresponding photocurrents.

In Step 530, measurements of individual photocurrents are determined using the differential voltage and a current measured through the cathode in accordance with one or more embodiments. Using various circuit parameters of a transimpedance amplifier circuit and/or a photodetector circuit, the individual photocurrents within a photodetector circuit may be measured accordingly. In one or more embodiments, for example, the individual photocurrents may be measured as described in FIG. 4. In one or more embodiments, individual photocurrents are calculated for optical signals regarding different optical channels. For example, different optical channels may include an optical signal with an x-polarization in phase (XI), an optical signal with an x-polarization out of phase (XQ), an optical signal with a y-polarization in phase (YI), and/or an optical signal with a y-polarization out of phase (YQ).

In Step 540, a determination is made whether an optical waveguide alignment satisfies a predetermined criteria in accordance with one or more embodiments. In one or more embodiments, the predetermined criteria describes an optical system's ability to reject common-mode optical noise, such as for a particular common-mode rejection ratio specification. Thus, the individual photocurrent measurements determined in Step 530 are used to verify whether the optical alignment satisfies the common-mode rejection ratio specification. If the common-mode optical noise is outside the predetermined criteria based on the individual photocurrent measurements, then the optical waveguide alignment fails the common-mode rejection ratio specification.

When it is determined that optical waveguide alignment fails to satisfy the predetermined criteria, the process may proceed to Step 550. When it is determined that optical waveguide alignment satisfies the predetermined criteria, the process ends.

In Step 550, an optical waveguide is realigned to increase photocurrent through a cathode in accordance to one or more embodiments. In one or more embodiments, for example, the optical waveguide alignment is adjusted to increase a particular photocurrent corresponding to a type of optical signal. Thus, the photocurrent for an XI optical signal ($I_{TOTAL\_XI}$) may be increased by changing the optical waveguide alignment. Accordingly, the photocurrent for XQ ($I_{TOTAL\_XQ}$), the photocurrent for YI optical signal ($I_{TOTAL\_YI}$), and the photocurrent for YQ optical signal ($I_{TOTAL\_YQ}$) may be increased as well. In one or more embodiments, the optical waveguide is aligned to obtain an aggregate photocurrent maximum ($I_{TOTAL}$), i.e., where the aggregate photocurrent maximum is equal to $(I_{TOTAL})=(I_{TOTAL\_XI})+(I_{TOTAL\_XQ})+(I_{TOTAL\_YI})+(I_{TOTAL\_YQ})$. Thus, the individual photocurrent measurements obtained in Step 530 may determine the aggregate photocurrent maximum.

In Step 560, the optical waveguide is realigned to balance individual photocurrents in accordance with one or more embodiments. In one or more embodiments, the optical waveguide is realigned such that the differential voltage signal obtained from a DCMD for each optical channel (e.g., XI, XQ, YI, and YQ) approaches 0 Volts.

In one or more embodiments, Steps 510-540 are repeated iteratively until the optical waveguide satisfies the predetermined criteria at Step 540. In particular, the optical waveguide may be aligned through trial and error until the individual photocurrent measurements satisfy Steps 550-560.

Figure 6:
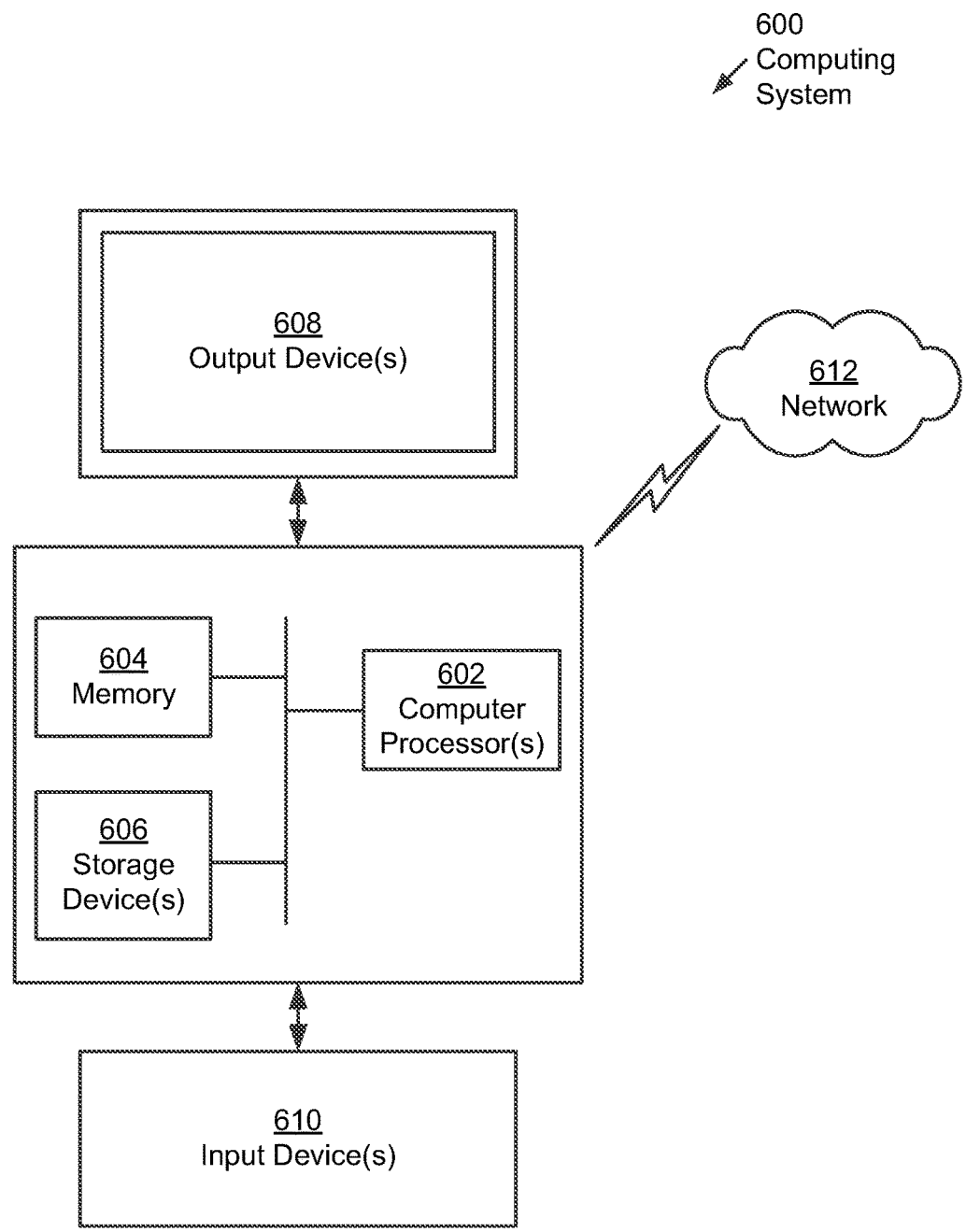
FIG. 6 shows a computing system in accordance with one or more embodiments.

Embodiments of the invention may be implemented on a computing system. Any combination of mobile, desktop, server, embedded, or other types of hardware may be used. For example, as shown in FIG. 6, the computing system (600) may include one or more computer processor(s) (602), associated memory (604) (e.g., random access memory (RAM), cache memory, flash memory, etc.), one or more storage device(s) (606) (e.g., a hard disk, an optical drive such as a compact disk (CD) drive or digital versatile disk (DVD) drive, a flash memory stick, etc.), and numerous other elements and functionalities. The computer processor(s) (602) may be an integrated circuit for processing instructions. For example, the computer processor(s) may be one or more cores, or micro-cores of a processor. The computing system (600) may also include one or more input device(s) (610), such as a touchscreen, keyboard, mouse, microphone, touchpad, electronic pen, or any other type of input device. Further, the computing system (600) may include one or more output device(s) (608), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (600) may be connected to a network (612) (e.g., a local area network (LAN), a wide area network (WAN) such as the Internet, mobile network, or any other type of network) via a network interface connection (not shown). The input and output device(s) may be locally or remotely (e.g., via the network (612)) connected to the computer processor(s) (602), memory (604), and storage device(s) (606). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (600) may be located at a remote location and connected to the other elements over a network (612). Further, embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system, comprising:
a photodetector circuit comprising a first photodetector, a second photodetector, and a cathode coupled to the first photodetector and the second photodetector;
a total current monitoring device configured to measure an amount of current transmitted through the cathode; and
a transimpedance amplifier circuit coupled to the photodetector circuit and the total current monitoring device, wherein the transimpedance amplifier circuit comprises:
a first input terminal configured to obtain a first photocurrent from the first photodetector,
a second input terminal configured to obtain a second photocurrent from the second photodetector,
an amplifier configured to output, using the first photocurrent and the second photocurrent, a first output signal and a second output signal, and
a differential current monitoring device configured to determine a differential voltage proportional to a current difference between the first photocurrent and the second photocurrent.

2. The system of claim 1,
wherein the total current monitoring device and the differential current monitoring device are configured to couple to a computing device, and
wherein the computing device is configured to determine, using the differential voltage and the amount of the current transmitted through the cathode, an amount of the first photocurrent and an amount of the second photocurrent.

3. The system of claim 1,
wherein the cathode is configured to obtain an input voltage from a power supply,
wherein the cathode is further configured to apply the input voltage to the first photodetector to generate the first photocurrent, and
wherein the cathode is further configured to apply the input voltage to the second photodetector to generate the second photocurrent.

4. The system of claim 1,
wherein the differential current monitoring device comprises a differential amplifier having a third input terminal and a fourth input terminal,
wherein the third input terminal corresponds to a first voltage generated by the first photocurrent,
wherein the fourth input terminal corresponds to a second voltage generated by the second photocurrent, and
wherein the differential voltage is the difference between the first voltage and the second voltage.

5. The system of claim 1, further comprising:
a plurality of interconnections between the photodetector circuit and the transimpedance amplifier circuit, and wherein the plurality of interconnections comprises a bond wire connecting the cathode in the photodetector circuit to a terminal in the transimpedance amplifier circuit.

6. The system of claim 1,
wherein the current transmitted through the cathode comprises the first photocurrent and the second photocurrent.

7. The system of claim 1, wherein the transimpedance amplifier circuit comprises:
a first connector pin configured to obtain the current transmitted through the cathode, and
a second connector pin configured to output the differential voltage.

8. A transimpedance amplifier circuit, comprising:
an output terminal configured to transmit a current to a cathode in a photodetector circuit;
a first input terminal configured to obtain a first photocurrent from a first photodetector in the photodetector circuit,
a second input terminal configured to obtain a second photocurrent from a second photodetector in the photodetector circuit,
an amplifier configured to output, using the first photocurrent and the second photocurrent, a first output signal and a second output signal, and
a differential current monitoring device coupled to the amplifier, wherein the differential current monitoring device is configured to determine a differential voltage proportional to a current difference between the first photocurrent and the second photocurrent.

9. The transimpedance amplifier circuit of claim 8,
wherein the differential current monitoring device is configured to couple to a computing device,
wherein the computing device is configured to determine, using the differential voltage and an amount of the current transmitted to the cathode, an amount of the first photocurrent and an amount of the second photocurrent.

10. The transimpedance amplifier circuit of claim 8,
wherein the differential current monitoring device comprises a differential amplifier having a third input terminal and a fourth input terminal,
wherein the third input terminal corresponds to a first voltage generated by the first photocurrent,
wherein the fourth input terminal corresponds to a second voltage generated by the second photocurrent, and
wherein the differential voltage is the difference between the first voltage and the second voltage.

11. The transimpedance amplifier circuit of claim 8, further comprising:
a first pin configured to obtain an input voltage for the cathode, and
a second pin configured to output the differential voltage.

12. The transimpedance amplifier circuit of claim 8,
wherein the current transmitted to the cathode comprises the first photocurrent and the second photocurrent.

13. A method for monitoring a circuit, comprising:
obtaining, using a total current monitoring device, a measurement of a current transmitted through a cathode in a photodetector circuit, wherein the current comprises a first photocurrent for a first photodetector and a second photocurrent for a second photodetector;
obtaining, using a differential current monitoring device in a transimpedance amplifier circuit, a differential voltage proportional to a current difference between the first photocurrent and the second photocurrent, wherein the transimpedance amplifier circuit is configured to generate, using the first photocurrent and the second photocurrent, a first output signal and a second output signal; and
determining, using the differential voltage and the measurement of the current transmitted through the cathode, an amount of the first photocurrent and an amount of the second photocurrent.

14. The method of claim 13, further comprising:
obtaining, using the amount of the first photocurrent and the amount of the second photocurrent, a measurement of crosstalk within the transimpedance amplifier circuit.

15. The method of claim 13, further comprising:
obtaining, using the amount of the first photocurrent and the amount of the second photocurrent, a measurement of a frequency response of an optical receiver,
wherein the optical receiver comprises the photodetector circuit and the transimpedance amplifier circuit.

16. The method of claim 13,
wherein the total current monitoring device is located between the cathode and a power supply configured to provide an input voltage to the first photodetector and the second photodetector.

17. The method of claim 13, further comprising:
aligning, using the amount of the first photocurrent and the amount of the second photocurrent, an optical waveguide to the first photodetector and the second photodetector.

18. The method of claim 17, further comprising:
determining that the first photocurrent and the second photocurrent fail to satisfy a predetermined criteria; and
realigning the optical waveguide to increase the first photocurrent and the second photocurrent.

19. The method of claim 18,
wherein the predetermined criteria corresponds to a predetermined common-mode rejection ratio for a differential signal outputted by the transimpedance amplifier circuit.

20. The method of claim 17, further comprising:
determining that the first photocurrent and the second photocurrent fail to satisfy a predetermined criteria; and
realigning the optical waveguide to balance the first photocurrent and the second photocurrent generated by a plurality of optical signals transmitted over a plurality of optical channels.

* * * * *